US008530252B2

United States Patent
Chang et al.

(10) Patent No.: US 8,530,252 B2
(45) Date of Patent: Sep. 10, 2013

(54) METHOD FOR MANUFACTURING LIGHT EMITTING DIODE

(75) Inventors: Chao-Hsiung Chang, Hsinchu (TW); Chieh-Ling Chang, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 38 days.

(21) Appl. No.: 13/216,246

(22) Filed: Aug. 24, 2011

(65) Prior Publication Data
US 2012/0122256 A1    May 17, 2012

(30) Foreign Application Priority Data
Nov. 11, 2010   (CN) ............................ 2010 1 0539600

(51) Int. Cl.
*H01L 21/00*    (2006.01)
(52) U.S. Cl.
USPC ..................................... 438/28; 257/E33.057
(58) Field of Classification Search
USPC ................ 438/28; 257/E33.059, E33.057
See application file for complete search history.

(56) References Cited

U.S. PATENT DOCUMENTS

| 6,383,835 | B1 * | 5/2002 | Hata et al. ........................ 438/65 |
| RE39,261 | E * | 9/2006 | Floyd et al. ................ 359/224.1 |
| 2003/0151144 | A1 | 8/2003 | Muta et al. |
| 2008/0203420 | A1 | 8/2008 | Higaki et al. |
| 2011/0248200 | A1 * | 10/2011 | Fathauer ................... 251/129.15 |
| 2011/0291153 | A1 * | 12/2011 | Yang et al. ...................... 257/99 |

FOREIGN PATENT DOCUMENTS

| TW | 200302527 A | 8/2003 |
| TW | 200824058 A | 6/2008 |

* cited by examiner

*Primary Examiner* — William D Coleman
*Assistant Examiner* — Christine Enad
(74) *Attorney, Agent, or Firm* — Altis Law Group, Inc.

(57) ABSTRACT

A method for manufacturing light emitting diodes includes steps of: providing a base have an upper conductive layer and a lower conductive layer on a top face and a bottom face thereof, respectively; forming a plurality of through holes in the base; defining a plurality of grooves to divide the upper and lower conductive layers into discrete strips; forming a connection layer on an inner circumferential face of each hole to connect the opposite strips of the upper and lower conductive layers; filling a supporting layer in an upper portion of each hole; forming a reinforcing layer on the supporting layer and the upper conductive layer; fixing chips on the reinforcing layer and electrically connecting the chips with the strips of the upper conductive layer; forming an encapsulant on the reinforcing layer; and cutting the base into individual LEDs along the holes.

14 Claims, 10 Drawing Sheets

METHOD FOR MANUFACTURING LIGHT EMITTING DIODE

BACKGROUND

1. Technical Field

The present disclosure relates to a method for manufacturing light emitting diodes, and more particularly, to a method for reliably manufacturing light emitting diodes.

2. Description of Related Art

As a new type light source, LEDs are widely used in various applications. A typical method for manufacturing LEDs is cutting an LED board into a plurality of individual LEDs. The LED board includes a base having two electrical traces respectively formed on top and bottom faces thereof, a plurality of LED chips mounted on the top electrical trace and an encapulant adhered on the top face of the base and sealing the chips.

Before the encapsulant is molded on the top face of the base, a plurality of through holes are defined in the base extending from the bottom electrical trace to the top electrical trace, and an insulation material (such as a green solder mask) is applied on the top electrical trace to cover each through hole, thereby preventing the encapsulant from falling into the through holes during molding. However, the mechanical strength of the green solder mask is limited and may collapse under impact when the encapsulant is molded on the base. Therefore, a risk that the encapsulant falls into the through holes exists, which may affect the next manufacturing process of the LEDs.

What is needed, therefore, is a method for manufacturing light emitting diodes which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

A method for manufacturing light emitting diodes in accordance with an embodiment of the present disclosure is disclosed. The method mainly includes multiple steps as described below.

Figure 1:
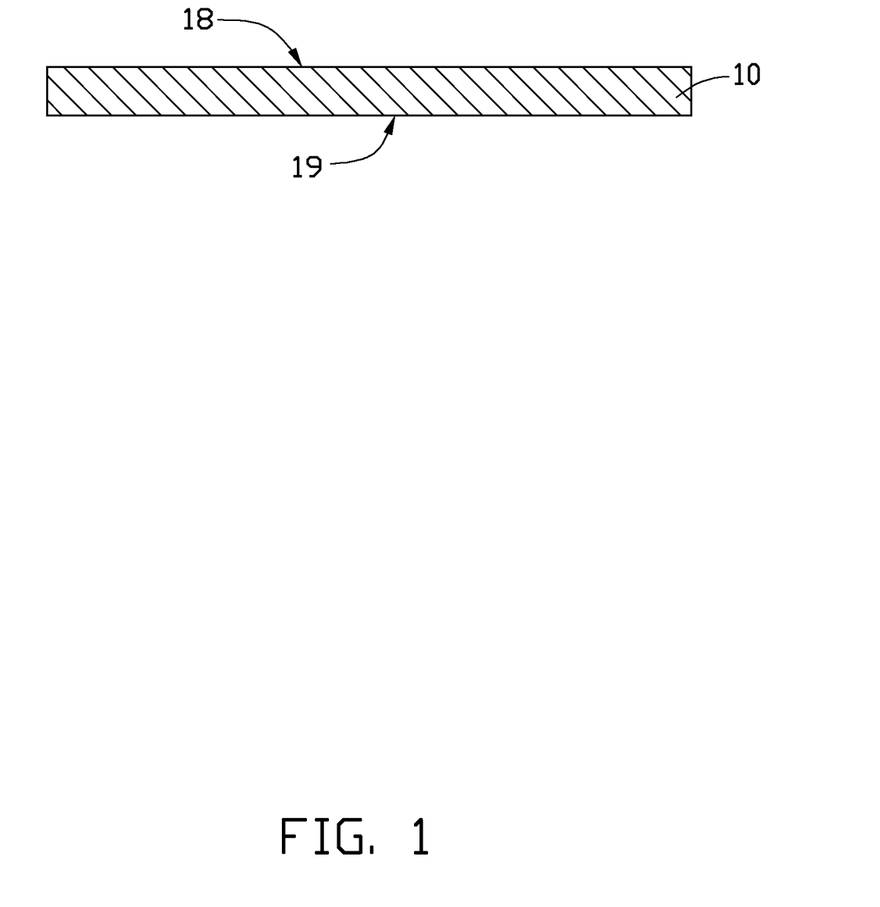
FIG. 1 shows a first process of manufacturing light emitting diodes in accordance with an embodiment of the present disclosure.

As shown in FIG. 1, a substrate 10 is provided. The substrate may be made of plastic, ceramic or other electrically insulating materials. The substrate has a flat top face 18 and a flat bottom face 19 opposite to the top face 18.

Figure 2:
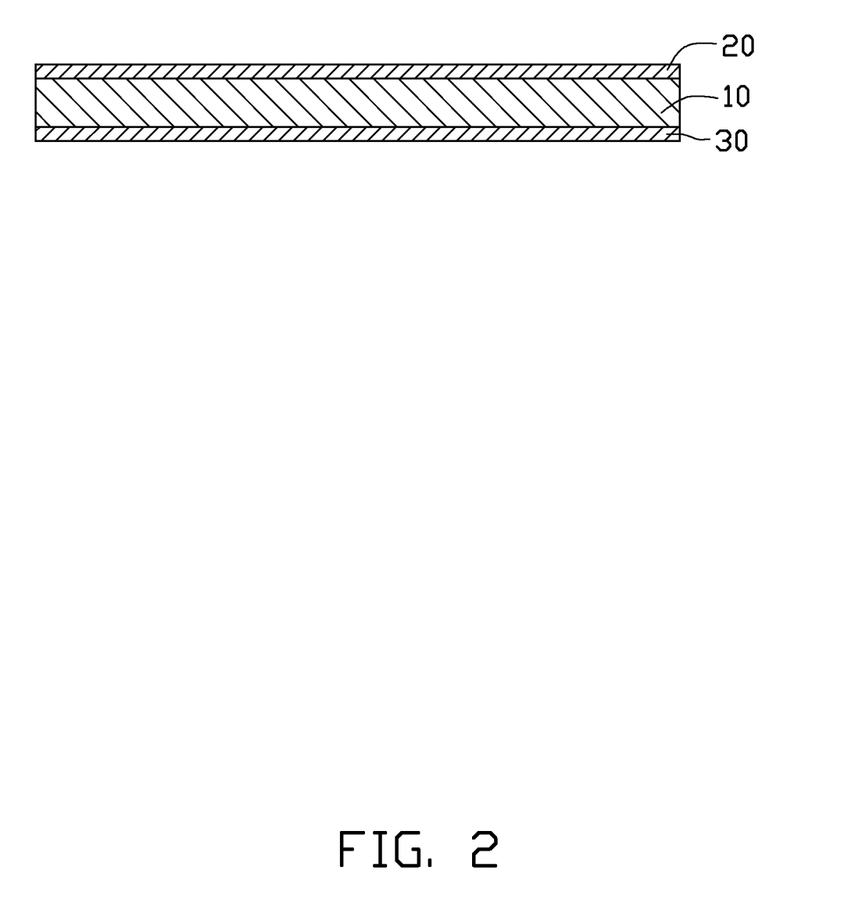
FIG. 2 shows a second process of manufacturing light emitting diodes in accordance with the embodiment of the present disclosure.

As shown in FIG. 2, an upper conductive layer 20 and a lower conductive layer 30 are formed on the top face 18 and the bottom face 19 of the base 10, respectively. The upper conductive layer 20 and the lower conductive layer 30 are parallel to each other and both are made of metal such as copper, aluminum or silver.

Figure 3:
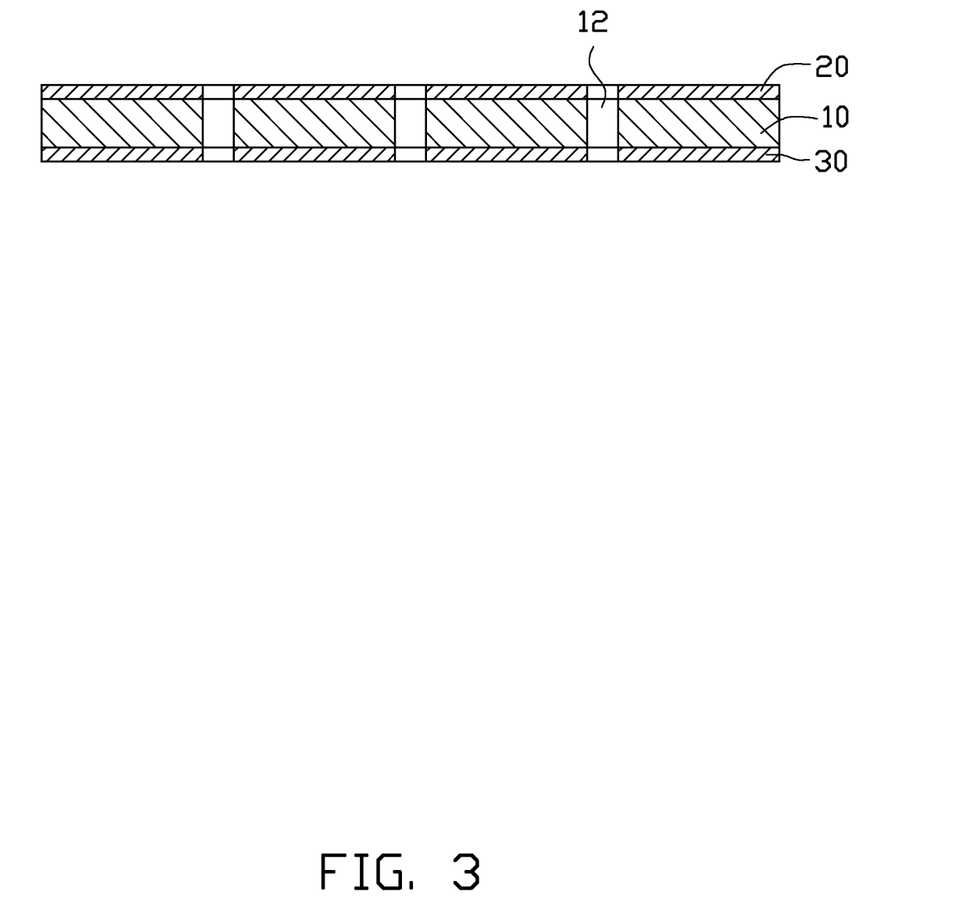
FIG. 3 shows a third process of manufacturing light emitting diodes in accordance with the embodiment of the present disclosure.
Figure 4:
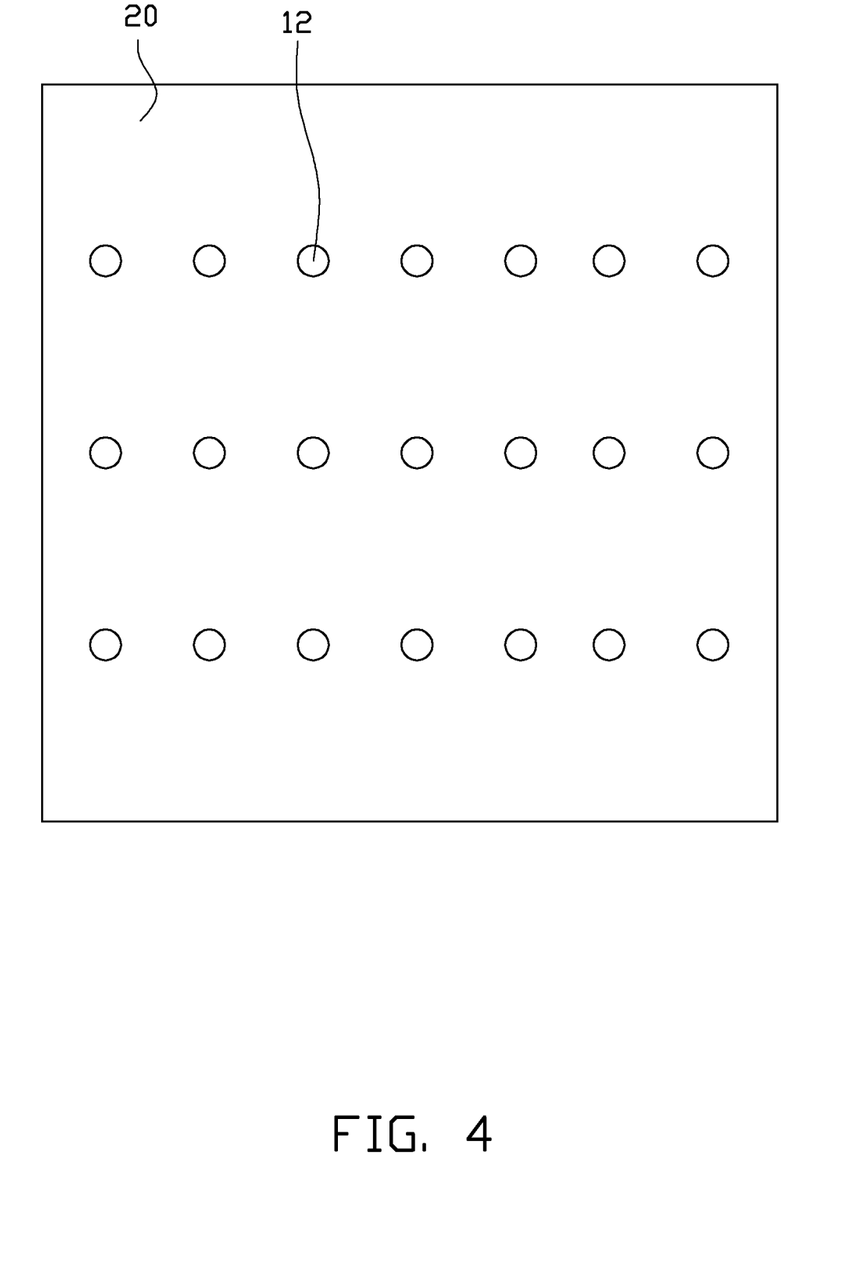
FIG. 4 is top view of a semi-finished product obtained from the third process of manufacturing light emitting diodes of FIG. 3.

Then a plurality of through holes 12 are defined in the base 10 as shown in FIGS. 3-4. Each through hole 12 extends from the lower conductive layer 30 to the upper conductive layer 20. The through holes 12 may be formed by drilling, laser or other suitable methods. The through holes 12 are arranged as a matrix, including multiple rows and columns as viewed from a top of the base 10 shown in FIG. 4.

Figure 5:
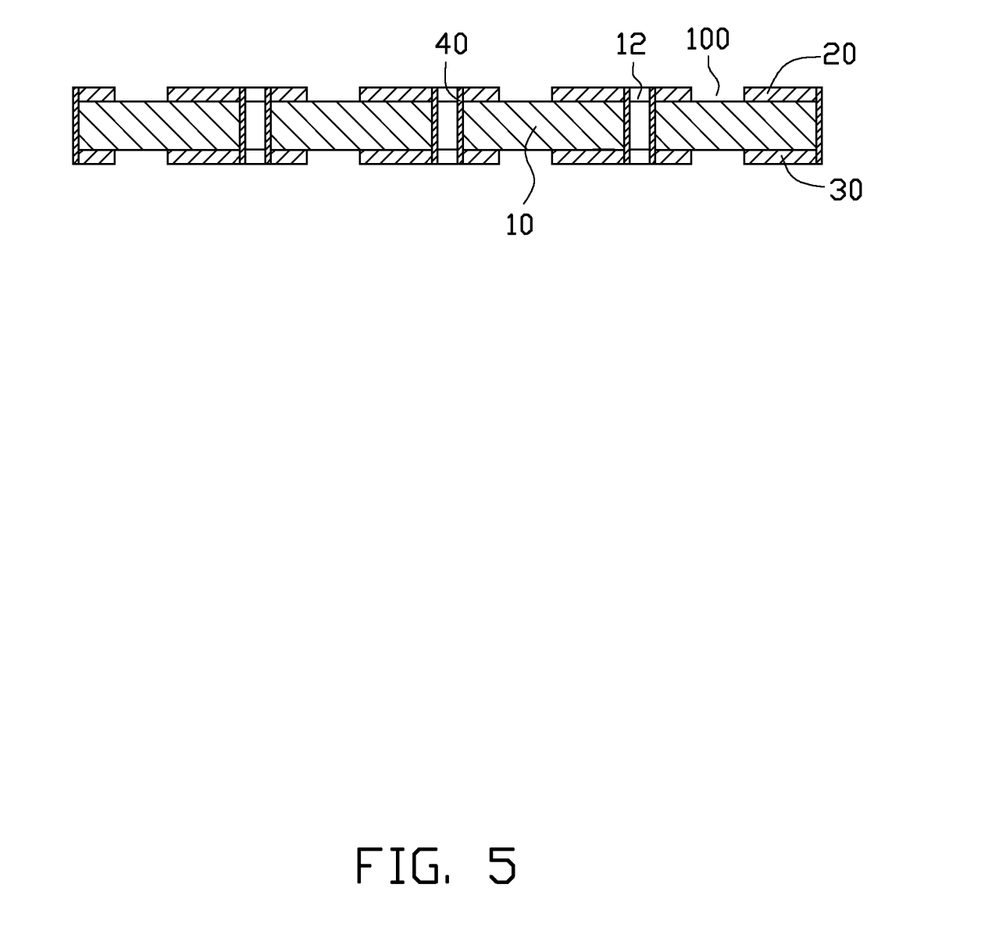
FIG. 5 shows a fourth process of manufacturing light emitting diodes in accordance with the embodiment of the present disclosure.
Figure 6:
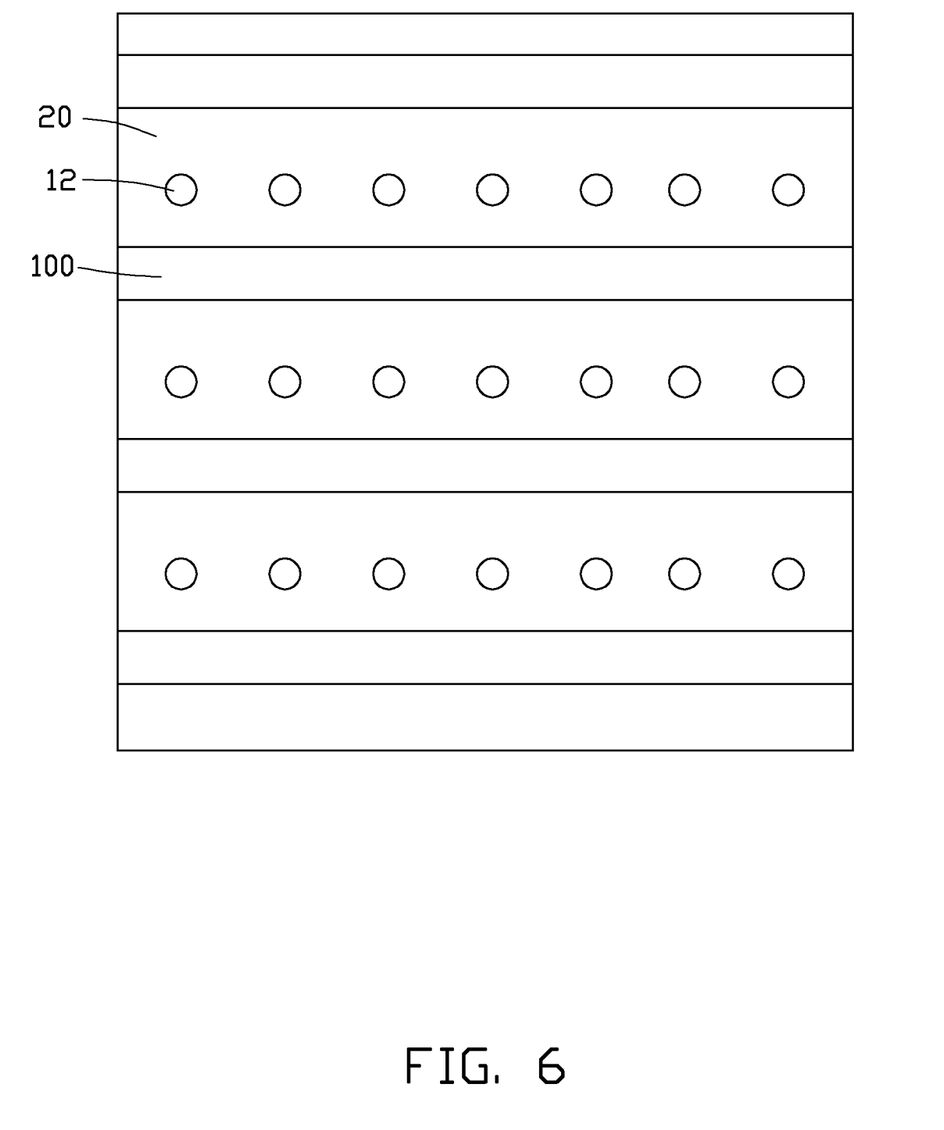
FIG. 6 is a top view of a semi-finish product obtained from the fourth process of manufacturing light emitting diodes of FIG. 5.

As shown in FIGS. 5-6, a plurality grooves 100 are defined in the upper conductive layer 20 and the lower conductive layer 30 to expose strip-shaped areas of the top face 18 and bottom face 19 of the base 10, respectively. Each of the upper conductive layer 20 and the lower conductive layer 30 are divided into a plurality of discrete strips by the grooves 100. The grooves 100 are arranged in an alternate relation with the rows of the through holes 12 as shown in FIG. 6 so that each strip of the upper conductive layer 20 and a correspondingly opposite strip of the lower conductive layer 30 have one row of through holes 12 defined therein. A connection layer 40 is formed on an inner circumferential face of each through hole 12. The connection layer 40 interconnects the upper conductive layer 20 and the lower conductive layer 30, wherein left parts of the strips of the upper conductive layer 20 and the lower conductive layer 30 adjacent to each through hole 12 and a left part of the connection layer 40 in the through hole 12 cooperatively form a first lead. Right parts of the strips of the upper conductive layer 20 and the lower conductive layer 30 adjacent to each through hole 12 and a right part of the connection layer 40 in the through hole 12 cooperatively form a second lead. The first lead and the second lead adjacent to the same through hole 12 are connected to each other via the connection layer 40.

Figure 7:
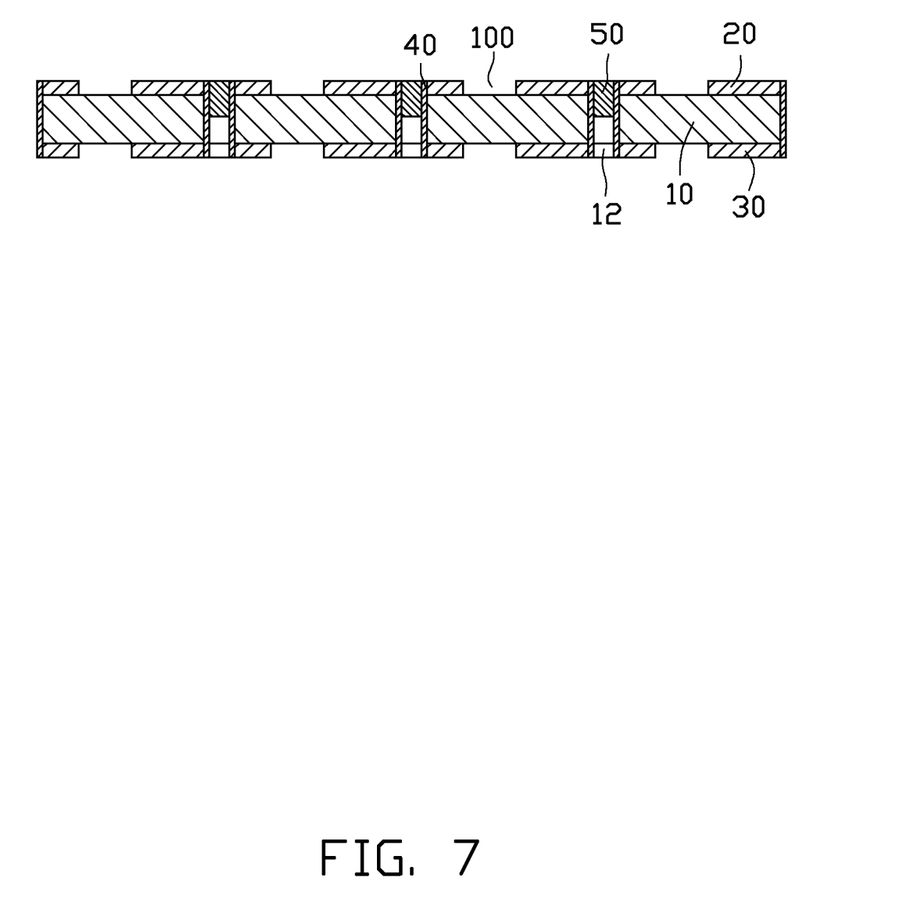
FIG. 7 shows a fifth process of manufacturing light emitting diodes in accordance with the embodiment of the present disclosure.

An insulation layer 50 is then filled into an upper portion of each through hole 12 as shown in FIG. 7. A lower portion of each through hole 12 keeps empty for facilitating subsequent cutting process of the base 10. The insulation layer 50 has a top face coplanar with that of the upper conducive layer 20, and a bottom face located higher than the bottom face 19 of the base 10. The insulation layer 50 may be made of green solder mask or other materials having sufficient adhesive force. The insulation layer 50 has a thickness large enough for increasing a strength thereof. Preferably, the thickness of the insulation layer 50 is about a half of a thickness of the base 10.

Figure 8:
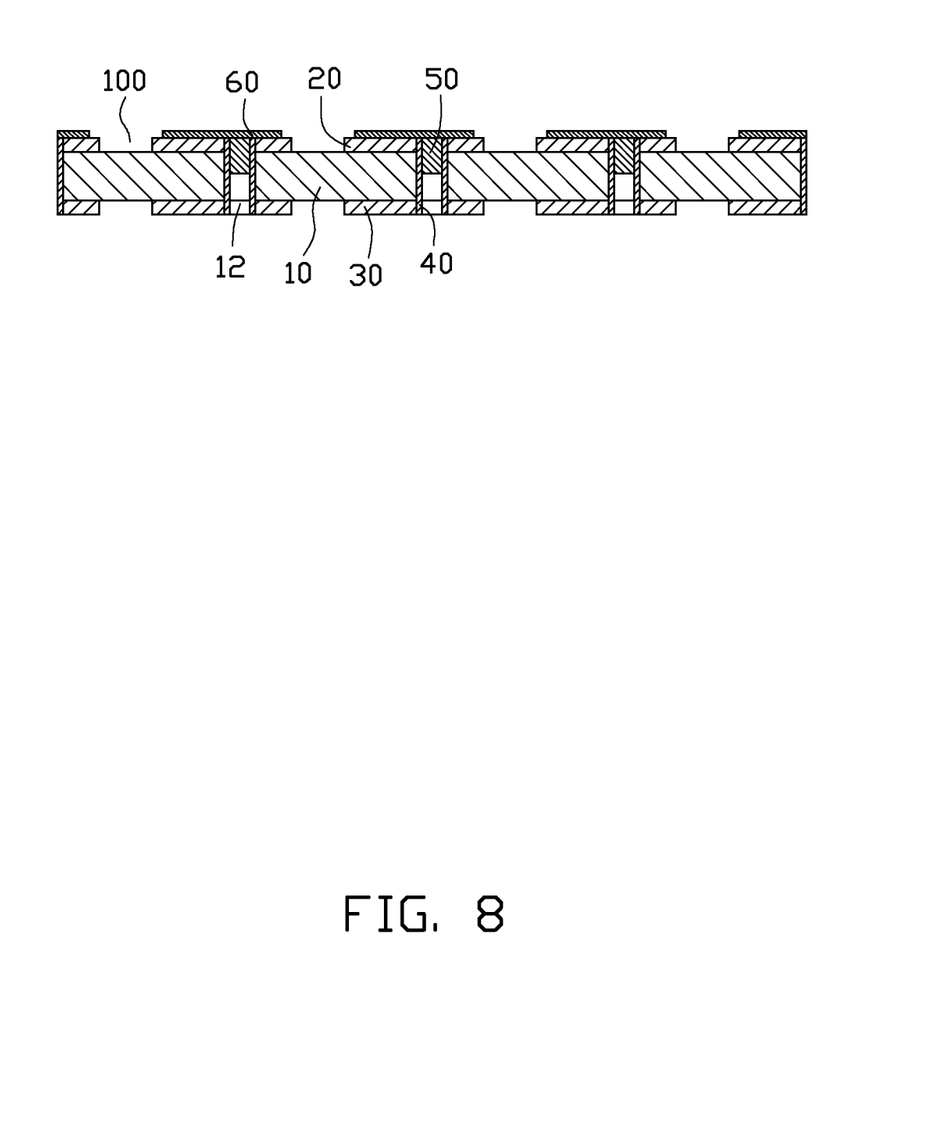
FIG. 8 shows a sixth process of manufacturing light emitting chips in accordance with the embodiment of the present disclosure.

As shown in FIG. 8, a reinforcing layer 60 is formed on the top faces of the upper conductive layer 20 and the insulation layer 50. The reinforcing layer 60 connects with the upper conductive layer 20 and the insulation layer 50 for further increasing the strength of the insulation layer 50. The reinforcing layer 60 is separated from the grooves 100 defined in the upper conductive layer 20, whereby the reinforcing layer 60 is also divided by the grooves 100 into multiple strips. In this embodiment, each strip of the reinforcing layer 60 has an area smaller than that of each strip of the upper conductive layer 20 so that each strip of the upper conductive layer 20 has two elongated areas exposed at two opposite sides of a corresponding strip of the reinforcing layer 60. Alternatively, each strip of the reinforcing layer 60 can also have the area identical to that of each strip of the upper conductive layer 20 so that the strips of the upper conductive layer 20 are substantially covered by the strips of the reinforcing layer 60. The reinforcing layer 60 is preferably made of gold for protecting the upper conductive layer 20 from oxidization by surrounding air. Alternatively, other metal materials can also used to make the reinforcing layer 60 if the upper conductive layer 20 is made of a noble metal such as gold.

Figure 9:
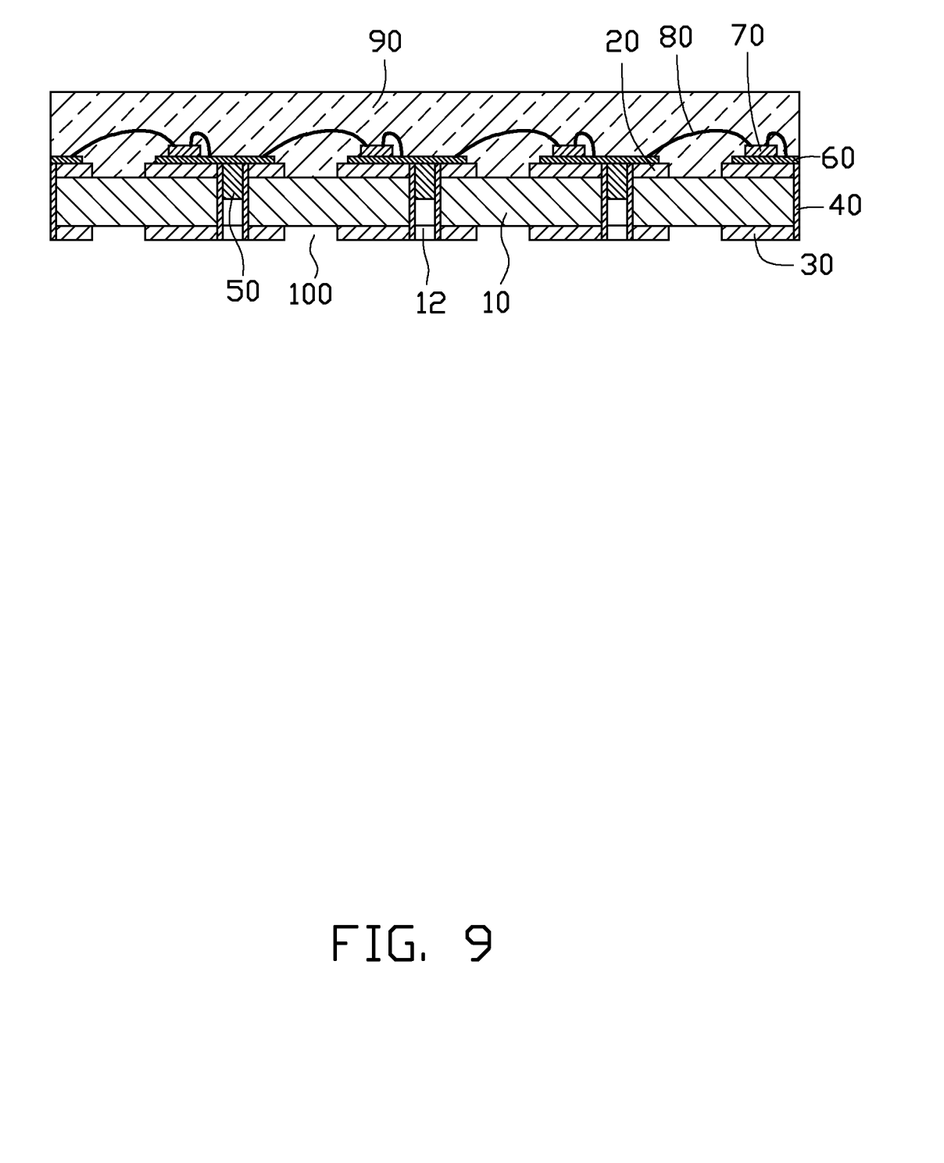
FIG. 9 shows a seventh process of manufacturing light emitting diodes in accordance with the embodiment of the present disclosure.

As shown in FIG. 9, a plurality of chips 70 are fixed on the top face of the reinforcing layer 60 and an encapsulant 90 is molded on the base 10 to seal the chips 70. Each chip 70 is located above a left part of the strip of the upper conductive layer 20 in respect to a correspondingly adjacent through hole 12. Each chip 70 has two wires 80 directly connecting with two adjacent strips of the reinforcing layer 60, wherein a right wire 80 is bonded to a left part of a corresponding strip of the reinforcing layer 60 where the chip 70 is located (i.e., electrically connected to the first lead), and a left wire 80 is bonded to a right part of an adjacent strip of the reinforcing layer 60 (i.e., electrically connected to the second lead). The mounting positions of the chips 70 and the wires 80 are designed to not to extend over the through holes 12. The chip 70 may be made of GaN, InGaN, AlInGaN or other suitable light emitting semiconductor materials. The encapsulant 90 is adhered on the exposed top face 18 of the base 10 and the exposed top face (not labeled) of the upper conductive layer 20 and the exposed top face (not labeled) of the reinforcing layer 60. The encapsulant 90 may be made of transparent materials such as epoxy, silicon, glass or the like. The reinforcing layer 60 and the insulation layer 50 can provide sufficient support for the encapsulant 90 during molding of the encapsulant 90 on the reinforcing layer 60, whereby the reinforcing layer 60 and the insulation layer 50 would not collapse to cause the encapsulant 90 to fall into the through holes 12.

Figure 10:
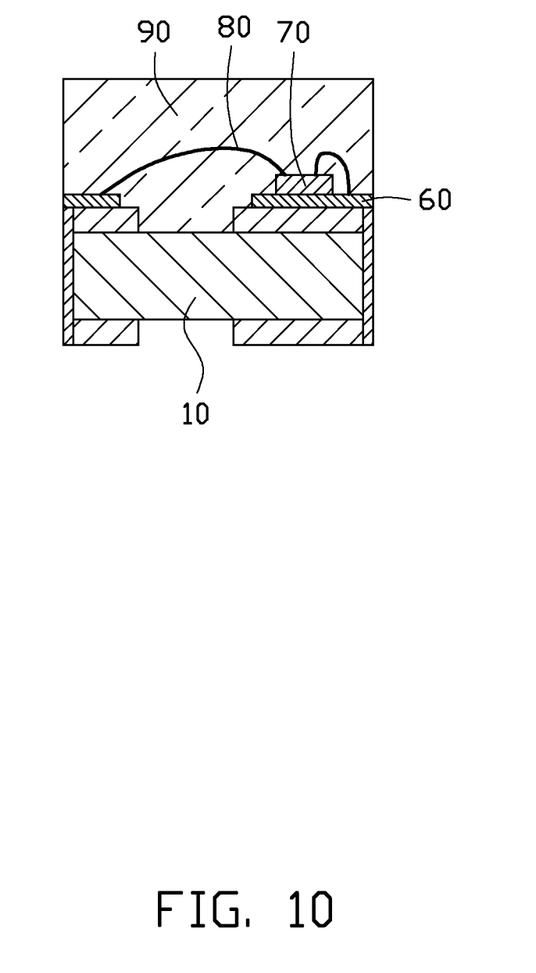
FIG. 10 shows a light emitting diode which has been manufactured after the processes of FIGS. 1-9.

Finally, the base 10 together with the upper conductive layer 20, the lower conductive layer 30, the reinforcing layer 60, the insulation layer 50, the chips 70 and the encapsulant 90 mounted thereon, are cut into a plurality of individual LEDs along the through holes 12. FIG. 10 shows one of the individual LEDs which includes one first lead, one second lead and a chip 70 electrically connected to the first lead and the second lead.

The reinforcing layer 60 which is made of metal can provide a large area for bonding the wires 80, whereby the bonding process of the wires 80 is simplified. Furthermore, the metal reinforcing layer 60 can also act as a reflective layer for reflecting light emitted from the chip 70 to an outside of the LED, whereby a light extraction efficiency of the LED is increased.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. A method for manufacturing light emitting diodes, comprising steps:
    providing a base having an upper electrically conductive layer and a lower electrically conductive layer formed on a top face and a bottom face thereof, respectively;
    forming a plurality of through holes extending from the upper conductive layer through the base to the lower conductive layer;
    forming a connection layer on an inner circumferential face of each of the through holes to connect the upper conductive layer with the lower conductive layer;
    filling a supporting material in each of the through holes, wherein the supporting material is made of electrically insulating material;
    forming a reinforcing layer on the upper conductive layer and the supporting material, wherein the reinforcing layer is made of electrically conductive material;
    electrically connecting a plurality of chips with the upper conductive layer;
    forming an encapsulant on the reinforcing layer to seal the chips; and
    cutting the base into a plurality of LEDs along the through holes;
    wherein each of the upper conductive layer and the lower conductive layer is divided by a plurality of grooves into discrete strips after forming the through holes;
    wherein the supporting material has a top face coplanar with that of the upper conductive layer; and
    wherein the reinforcing layer completely covers the top faces of the upper conductive layer and the supporting material.

2. The method for manufacturing light emitting diodes of claim 1, wherein the through holes are defined in the strips of the upper conductive layer and the lower conductive layer.

3. The method for manufacturing light emitting diodes of claim 2, wherein the supporting material occupies an upper portion of each of the through holes only to keep a lower portion of each of the through holes empty.

4. The method for manufacturing light emitting diodes of claim 3, wherein the supporting material has a thickness more than a half a thickness of the base.

5. The method for manufacturing light emitting diodes of claim 1, wherein the supporting material is made of green solder mask.

6. The method for manufacturing light emitting diodes of claim 1, wherein the reinforcing layer covers the top faces of the upper conductive layer and the supporting material.

7. The method for manufacturing light emitting diodes of claim 6, wherein the reinforcing layer is separated from the grooves to form a plurality of discrete strips.

8. The method for manufacturing light emitting diodes of claim 7, wherein each strip of the reinforcing layer has an area smaller than that of each strip of the upper conductive layer.

9. The method for manufacturing light emitting diodes of claim 7, wherein the chips are mounted on top faces of the strips of the reinforcing layer, respectively.

10. The method for manufacturing light emitting diodes of claim 9, wherein locations of the chips on the strips of the reinforcing layer are beside the through holes, respectively.

11. The method for manufacturing light emitting diodes of claim 1, wherein the reinforcing layer is made of metal.

12. The method for manufacturing light emitting diodes of claim 1, wherein each of the chips is electrically connected to two adjacent strips of the upper conductive layer.

13. The method for manufacturing light emitting diodes of claim 1, wherein the encapsulant is connected to the top face of the base exposed in the grooves.

14. The method for manufacturing light emitting diodes of claim 1, wherein the connection layer is separated into two individual pieces after cutting the base.

* * * * *